US011146230B2

(12) United States Patent
Dellas et al.

(10) Patent No.: US 11,146,230 B2
(45) Date of Patent: Oct. 12, 2021

(54) METHOD FOR CREATING DOUBLE BRAGG MIRROR FOR TIGHT FREQUENCY REFERENCE CONTROL

(71) Applicant: Texas Instruments Incorporated, Dallas, TX (US)

(72) Inventors: Nicholas S Dellas, Dallas, TX (US); Brian Goodlin, Plano, TX (US); Ricky Jackson, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 98 days.

(21) Appl. No.: 16/553,518

(22) Filed: Aug. 28, 2019

(65) Prior Publication Data

US 2021/0067126 A1 Mar. 4, 2021

(51) Int. Cl.
*H03H 9/00* (2006.01)
*H03H 9/17* (2006.01)
*H01L 33/46* (2010.01)
*H01L 33/10* (2010.01)
*H01L 21/02* (2006.01)

(52) U.S. Cl.
CPC ..... *H03H 9/0014* (2013.01); *H01L 21/02164* (2013.01); *H01L 33/10* (2013.01); *H01L 33/46* (2013.01); *H03H 9/175* (2013.01)

(58) Field of Classification Search
CPC ........................... H03H 9/0014; H03H 9/175; H01L 21/02164; H01L 33/10; H01L 33/46

USPC .......................................................... 333/187
See application file for complete search history.

(56) References Cited

U.S. PATENT DOCUMENTS

| 9,929,714 B2 | 3/2018 | Jacobsen et al. |
| 2011/0080232 A1* | 4/2011 | Bar ........................ H03H 9/175 333/187 |

OTHER PUBLICATIONS

Zhang et al., "A Novel Bulk Acoustic Wave Resonator for Filters and Sensors Applications", Micromachines 2015, 6, 1306-1316; doi :10.3390/mi6091306 (Year: 2015).*

* cited by examiner

*Primary Examiner* — Hafizur Rahman
(74) *Attorney, Agent, or Firm* — Andrew R. Ralston; Charles A. Brill; Frank D. Cimino

(57) ABSTRACT

A method for creating a double Bragg mirror is provided. The method comprises providing a wafer having a plurality of bulk acoustic wave (BAW) devices at an intermediate stage of manufacturing. A first dielectric layer is deposited over the wafer. A plurality of as-deposited thicknesses of the dielectric layer are determined, each as-deposited thickness corresponding to one BAW device from the plurality of BAW devices. A corresponding trimmed dielectric layer over each of the BAW devices is formed by removing a portion of the dielectric layer over each of the BAW devices, with a thickness of the removed portion determined from a corresponding as-deposited thickness and a target thickness. A Bragg acoustic reflector that includes the corresponding trimmed dielectric layer is formed over each of the BAW devices.

20 Claims, 5 Drawing Sheets

METHOD FOR CREATING DOUBLE BRAGG MIRROR FOR TIGHT FREQUENCY REFERENCE CONTROL

BACKGROUND

A bulk acoustic wave (BAW) resonator is an electromechanical device that sandwiches a piezoelectric structure between a lower metallic electrode and an upper metallic electrode. An alternating electric field placed across the piezoelectric structure by way of the electrodes may excite a resonant frequency with a high Q-factor, making such devices useful in, among other things, RF filtering applications.

SUMMARY

The disclosure provides various methods that may be beneficially applied to manufacturing integrated circuits (ICs) such as double Bragg mirror bulk acoustic wave (BAW) resonators, e.g. to improve consistency of resonant frequency among device formed on a common substrate. While such embodiments may be expected to provide improved frequency matching among such devices, no particular result is a requirement of the described invention(s) unless explicitly recited in a particular claim.

Various examples provide a method of manufacturing a semiconductor device, e.g. a BAW resonator. For a wafer having a plurality of BAW devices at an intermediate stage of manufacturing, further forming of the BAW devices includes the following: depositing a dielectric layer over the wafer; determining a plurality of as-deposited thicknesses of the dielectric layer, each as-deposited thickness corresponding to one BAW device from the plurality of BAW devices; forming a corresponding trimmed dielectric layer over each of the BAW devices by removing a portion of the dielectric layer over each of the BAW devices, a thickness of the removed portion determined from a corresponding as-deposited thickness and a target thickness; and forming over each of the BAW devices a Bragg acoustic reflector that includes the corresponding trimmed dielectric layer.

The foregoing, and other features and advantages of the disclosure, will be apparent from the following, more particular description, with examples, the accompanying drawings, and the claims.

BRIEF DESCRIPTION OF THE DRAWINGS

For a more complete understanding of the present disclosure, the objects and advantages thereof, reference is now made to the ensuing descriptions taken in connection with the accompanying drawings briefly described as follows.

DETAILED DESCRIPTION

Figure 1A:
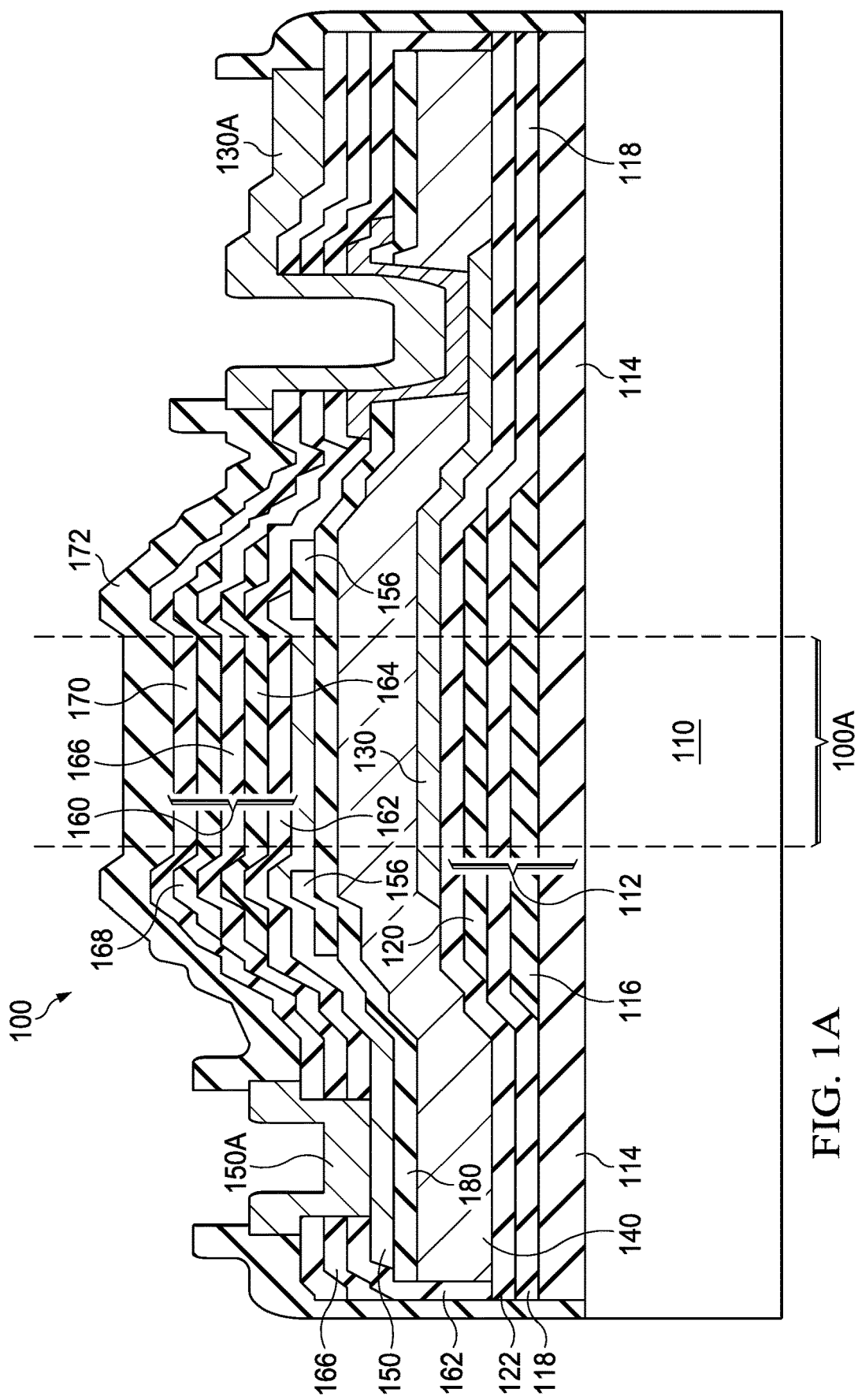
FIG. 1A illustrates a cross-sectional view showing an example of a bulk acoustic wave device.

Examples of the present disclosure and their advantages may be understood by referring to FIGS. 1A-3, wherein like reference numerals refer to like elements.

One type of BAW resonator is a solidly mounted resonator (SMR). A SMR uses a Bragg acoustic reflector over and/or under a piezoelectric layer to reflect an acoustic wave propagating in the resonator. A Bragg acoustic reflector is constructed with alternating layers of low-acoustic impedance and high-acoustic impedance material, where each layer of material has a thickness related to the wavelength of a fundamental resonant frequency of the SMR. Conventional deposition techniques may cause sufficient variation in the thickness some deposited layers to create inconsistent resonant frequency in the finished products. Wafer-level encapsulation, without top mirror deposition, is one method of limiting operating frequency shift variation. However, this method results in a higher production cost.

One potential source of frequency variation is thickness variation of a dielectric layer, e.g. an oxide layer, formed first over the piezoelectric layer. This disclosure recognizes that in many cases reduction of the thickness variation of this dielectric layer, formed over a pre-trimmed set of BAW resonators on a production wafer, is sufficient to ensure a desirably small frequency distribution of the BAW resonators after completion of an upper Bragg mirror over the dielectric layer. Based on the foregoing, there is a need in the art for a cost-efficient method of controlling the thickness of the first oxide layer deposited onto the wafer of a BAW device fabricated with a double Bragg mirror such that the end product yields a consistent and predictable frequency.

Figure 1B:
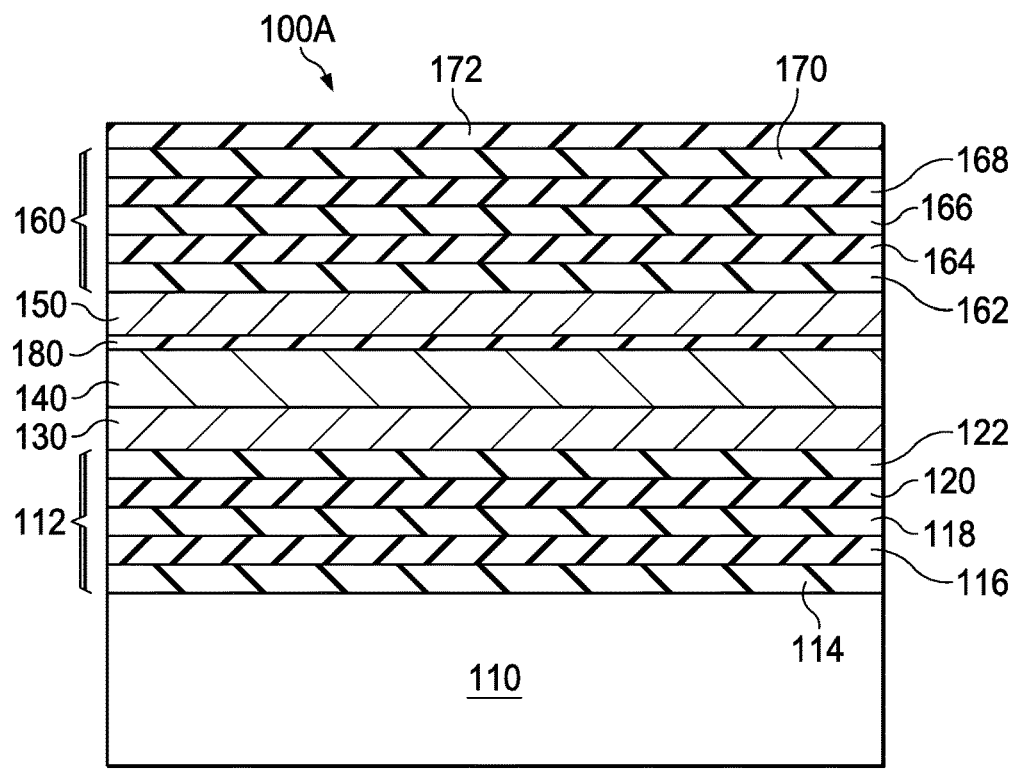
FIGS. 1B-1D illustrate successive stages of manufacturing of the bulk acoustic wave device with attention to an active area of the device.

FIG. 1A illustrates a cross-sectional view showing an example of a bulk acoustic wave (BAW) device 100 fabricated with a double Bragg mirror, and FIG. 1B illustrates a detailed sectional view of an active region 100A of the BAW device 100. In the example, a lower Bragg acoustic reflector 112 is provided over a top surface of a substrate 110 that may be a portion of an intact semiconductor wafer or may be a portion of a semiconductor wafer after singulating the BAW device 100 from other instances of the BAW device 100 also formed on the wafer. Substrate 110 may be implemented with a number of materials such as, but not limited to, silicon, silicon germanium, sapphire, glass, or quartz.

The lower Bragg acoustic reflector 112 includes a number of layers, which in the illustrated example includes a dielectric layer 114 which is adjacent substrate 110; a high-acoustic impedance layer 116 which is adjacent dielectric layer 114; a low-acoustic impedance layer 118 which is adjacent high-acoustic impedance layer 116; a high-acoustic impedance layer 120 which is adjacent low-acoustic impedance layer 118; and a low-acoustic impedance layer 122 which is adjacent high-acoustic impedance layer 120.

The dielectric layer 114 may be implemented with, e.g. $SiO_2$. The low-acoustic impedance layers 118, 122 may be implemented with a number of materials such as, but not limited to, methyl-silsesquioxane (MSQ), silicon dioxide ($SiO_2$), or hydrogen silsesquioxane (HSQ). The high-acoustic impedance layers 116, 120 may be implemented with a number of materials such as, but not limited to, silicon carbon (SiC), silicon-containing diamond-like-carbon (Si-DLC), or diamond-like-carbon (DLC).

As shown in FIGS. 1A-1B, BAW device 100 also includes: a lower electrode 130 adjacent lower Bragg acoustic reflector 112; and a piezoelectric structure 140 adjacent lower electrode 130. Lower electrode 130 may be implemented with a number of materials such as, but not limited to, molybdenum (Mo), titanium (Ti), tungsten (W), gold (Au), platinum (Pt), or aluminum (Al). In the present example, lower electrode 130 is implemented with Mo.

Piezoelectric structure 140, in turn, may be implemented with a number of materials such as, but not limited to, aluminum nitride (AlN), zinc oxide (ZnO) and lead zirconium titanate (PZT). In the present example, piezoelectric structure 140 is implemented with AlN. Piezoelectric structure 140 may have a thickness that is substantially equal to one-half of the wavelength of the fundamental resonant frequency of BAW device 100.

BAW device 100 also includes an isolation layer 180 that lies between piezoelectric structure 140 and upper electrode 150. The isolation layer may be a layer of silicon dioxide approximately 70 nanometers (nm) thick and may be formed on piezoelectric structure 140 before upper electrode 150 is formed. Upper electrode 150 may be implemented with a number of materials such as, but not limited to, Mo, Ti, W, Au, Pt, or Al. In the present example, upper electrode 150 is implemented with Mo.

As depicted in FIG. 1A, an optional guard ring 156 formed from any suitable conductor may be located over the isolation layer 180. The upper electrode 150 is formed, e.g. by sputtering, over guard ring 156 and the isolation layer 180, as shown. Additional details regarding the guard ring 156 may be found in U.S. patent application Ser. No. 16/284,831, incorporated herein by reference in its entirety.

As depicted in FIGS. 1A-1B BAW device 100 includes an upper Bragg acoustic reflector 160 that lies adjacent upper electrode 150. Upper Bragg acoustic reflector 160 includes a number of layers of material that alternate between a low-acoustic impedance material and a high-acoustic impedance material. In an example, the upper Bragg acoustic reflector 160 includes: a dielectric layer 162 that lies adjacent upper electrode 150; a high-acoustic impedance layer 164 that lies adjacent dielectric layer 162; a low acoustic impedance layer 166 that lies adjacent high-acoustic impedance layer 164; a high-acoustic impedance layer 168 that lies adjacent low-acoustic impedance layer 166; and a dielectric layer 170 that lies adjacent high-acoustic impedance layer 168. The dielectric layers 162, 170 may be formed from, e.g. $SiO_2$, and the low acoustic impedance layer 166 may be formed from, e.g. $SiO_2$, MSQ or HSQ. The high-acoustic impedance layers 164, 168 may be implemented with a number of materials such as, but not limited to, SiC, Si-DLC, or DLC.

The dielectric layer 162 may be referred to hereafter as first oxide layer 162. The first oxide layer 162 may be deposited over the piezoelectric structure 140 after the upper electrode 150 is formed, e.g. sputtered, onto the device. In various examples, the design of the BAW device 100 contemplates that the partially formed device 100 has an initial resonant frequency after the upper electrode 150 is formed, and that formation of the first oxide layer 162 will reduce the resonant frequency of the partially formed device 100 by a predetermined intended amount. The first oxide layer 162 is deposited with a thickness greater than that required for the intended frequency shift of the BAW device 100. The thickness of the first oxide layer 162 is then reduced to a final thickness. In an example, the final thickness is one-quarter of the wavelength of a frequency that is a higher harmonic resonant frequency of the fundamental resonant frequency.

After the first oxide layer 162 is deposited, a thickness map of the in-process BAW device is generated. The thickness of the first oxide layer 162 over the BAW devices 100 on the production substrate (e.g. wafer) may be determined by, e.g. ellipsometry, to generate the thickness map. Optionally, the thickness is determined over a subset of instances of the BAW devices 100, and generating the map includes interpolation of the thickness over instances of the BAW device between the measured subset of instances. A directly measured thickness and an interpolated thickness may both be referred to as an "as-deposited thickness". The thickness map may provide a measured or interpolated thickness of the first oxide layer 162 over all of the BAW devices 100 on the production wafer. The thickness map may be directed to and processed by a trimming tool. Using the thickness map, the trimming tool removes a portion of the first oxide layer 162 over each device 100 on the wafer, removing a greater amount over devices 100 having a greater thickness of the first oxide layer 162, and removing a lesser amount over devices 100 having a lesser thickness of the first oxide layer 162. Thus the trimming tool trims, or reduces, variations of the first oxide layer 162 thickness within the active region 100A of the BAW devices on the production wafer. The process results in a tighter tolerance of the plane including the top surface of the first oxide layer 162 than previously achievable.

The rest of the alternating layers of the upper Bragg acoustic reflector 160 are then deposited. These subsequent layers may have a relatively lower thickness nonuniformity either due to a different material deposition technique or a smaller target thickness. Due to the trimming process carried out at the surface of the first oxide layer 162, the total thickness of the upper Bragg acoustic reflector 160 is expected to have less variation than previously achievable.

Openings are formed in the layers 162, 166, 168 over the lower electrode 130 and the upper electrode 150. A layer of a suitable conductor, e.g. Mo, is formed over the layer 168 and patterned to form an electrode contact 130A to the lower electrode 130 and to form an electrode contact 150A to the upper electrode 150. An unreferenced strap electrode may optionally be formed over the electrode 130 after formation of the isolation layer 180, e.g. to provide etch margin when forming the opening in the layers 170, 166, 162. After forming the electrode contacts 130A, 150A a passivation overcoat (PO) layer 172 may be formed over the layer 166 and patterned to form openings to expose the lower electrode 130A and the upper electrode 150A.

In operation, the lower and upper electrodes 130 and 150 are connected to an alternating voltage source which, in turn, places an alternating electric field across piezoelectric structure 140. When the alternating electric field is at or near the resonant frequency of the BAW device 100, piezoelectric structure 140 mechanically deforms in a periodic manner and generates a standing acoustic wave at the fundamental resonant frequency of piezoelectric structure 140.

In one example, lower Bragg acoustic reflector 112 and upper Bragg acoustic reflector 160 include layer thicknesses equal to one-quarter of the wavelength of the fundamental resonant frequency. In another example, the BAW device 100 has lower and upper Bragg acoustic reflectors (112, 160) with layer thicknesses substantially equal to one-quarter of the wavelength of a frequency that is a higher harmonic resonant frequency of the fundamental resonant frequency. Each layer of material within upper Bragg acoustic reflector 160 may have a thickness that is substantially equal to the thickness of each layer of material within lower Bragg acoustic reflector 112, e.g., one-quarter of the wavelength of a frequency that is a higher harmonic resonant frequency of the fundamental resonant frequency of BAW device 100.

Because the desired fundamental resonant frequency or the desired higher harmonic resonant frequency of the fundamental resonant frequency is dependent upon the layer thickness of the upper and lower Bragg reflectors across the active region 100A, it is generally desirable that variations in thickness are reduced. The method provided herein improves the control of the thickness of the dielectric layer 162 and thus tightens frequency distribution.

Figure 1C:
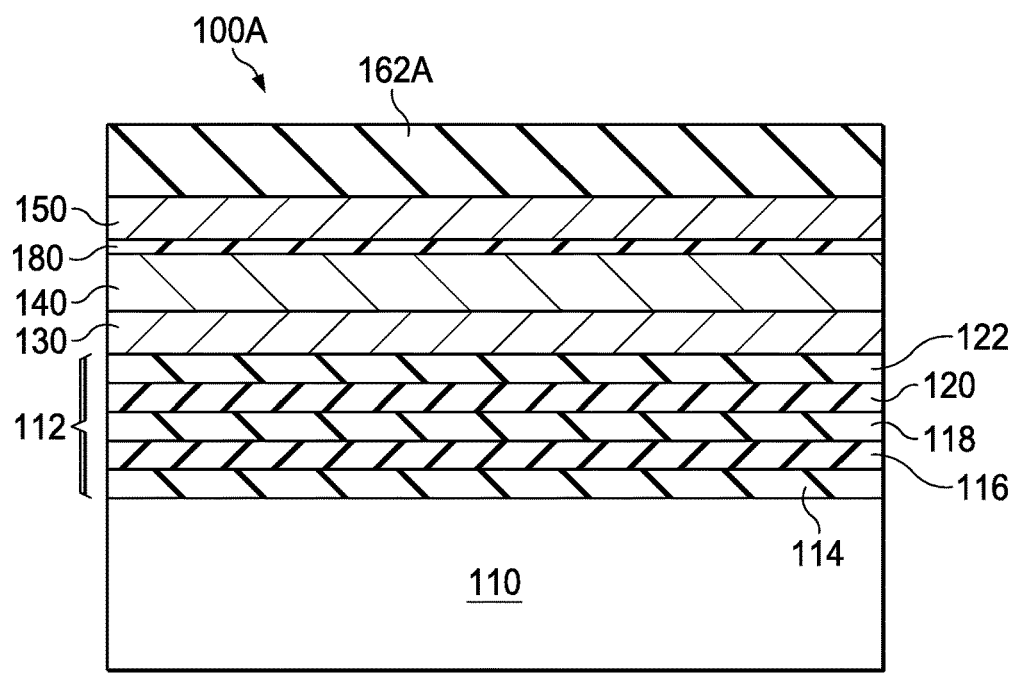
Figure 1D:
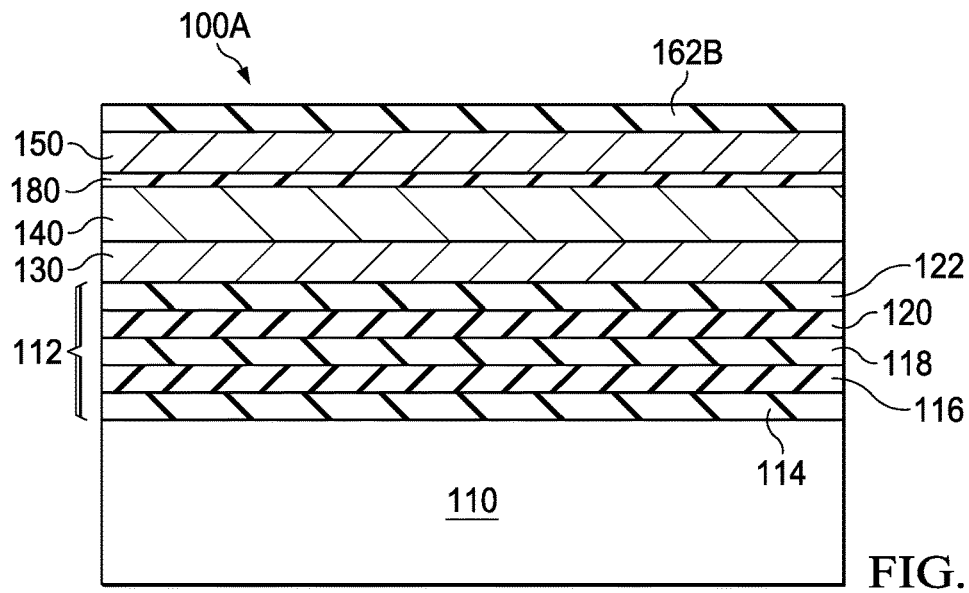

FIGS. 1C and 1D illustrate detailed cross-sectional views showing examples of the active region 100A of the BAW device 100 at an intermediate stage of formation in which the substrate 110 has not yet been singulated. As depicted in FIG. 1C-1D, initial first oxide layer 162A is deposited onto upper electrode 150 with a thickness greater than required for the intended frequency of operation. Optionally, each instance of the BAW device 100 on a production wafer may be frequency-trimmed prior to depositing the initial first oxide layer 162A so that all the instances of the BAW device 100 have a resonant frequency that falls within a desired tolerance, e.g. a variance within ±3000 ppm. After depositing the initial first oxide layer 162A, the BAW devices 100 will typically have a different resonant frequency distribution that has a lower median frequency and a wider frequency distribution. The difference between the median frequency before and after forming the first oxide layer 162A may be referred to as a "frequency shift". The wider distribution is caused at least in part by variation of the thickness of the as-deposited first oxide layer 162A.

The variations in thickness across active region 100A are then trimmed out. An ion beam milling process may be used for trimming. As depicted in FIG. 1D, trimmed first oxide layer 162B is trimmed to the thickness required for the intended frequency of operation. In one example the first oxide layer 162B is deposited with a thickness such that a thinnest portion over the production wafer is a desired final thickness, and the thickness of the first oxide layer 162B is reduced over all instances of the BAW device 100 on which the thickness of the first oxide layer 162B exceeds the desired final thickness. In another example, the first oxide layer 162B is deposited with a thickness such that a thinnest portion over the production wafer is greater than the desired final thickness. In this example the thickness of the first oxide layer 162B is reduced over all instances of the active region 100A of the BAW device. A portion of the first oxide layer 162B is removed over each instance of the BAW device 100 corresponding to the difference between the as-deposited thickness and the desired thickness. Thickness variations of less than ±3000 ppm may be achieved across each wafer, providing a tight distribution of the final operating frequencies of the BAW devices formed together on the wafer.

Figure 2A:
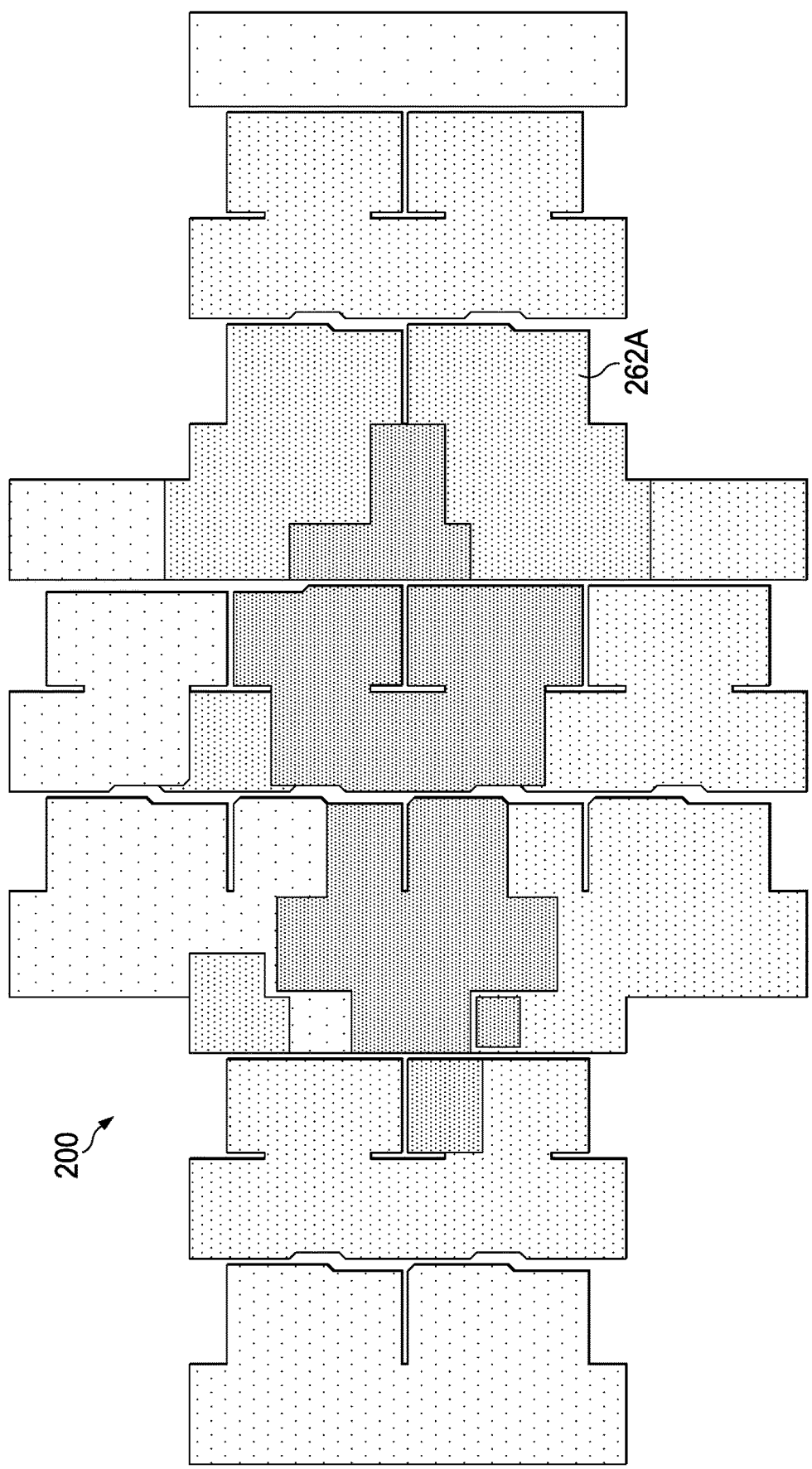
FIG. 2A illustrates a top plan view depicting a thickness map of an example of a bulk acoustic wave device prior to thickness trimming.

FIG. 2A shows a top plan view depicting a thickness map over the active region of an example bulk acoustic wave device prior to ion beam milling. As shown by FIG. 2A, a thickness map 200 is generated after deposition of a first oxide layer 262A of the upper Bragg reflector. The thickness map may be represented by a data structure within a computing device. The thickness varies as shown by the various fill levels on thickness map 200, wherein areas of higher dot density indicate greater thickness. The thickness map may be input to a trim tool that implements an ion beam milling process that removes a portion of the first oxide layer 262A from over each instance of the BAW device on the wafer. The amount of the first oxide layer 262A removed over each BAW device may be determined from the thickness map to result in a desired final thickness of the trimmed first oxide layer 162B.

Figure 2B:
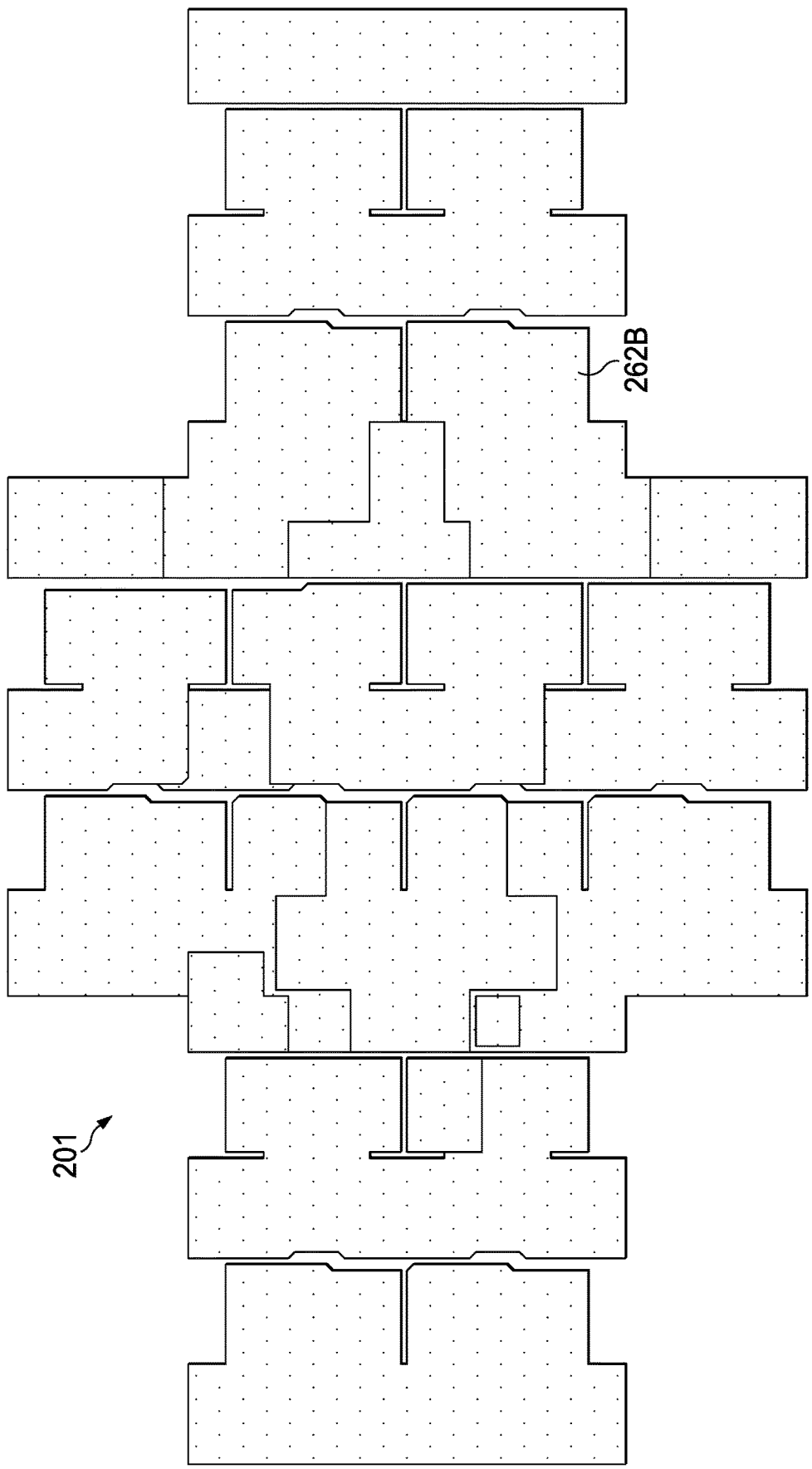
FIG. 2B illustrates a top plan view depicting a thickness map of an example of a bulk acoustic wave device after thickness trimming.

FIG. 2B illustrates a top plan view depicting a thickness map 201 of an example of a bulk acoustic wave device after ion beam trimming. The trim tool reduces the thickness of the first oxide layer 262A to the target thickness to achieve the desired operating frequency, as depicted in FIG. 2B. As shown in FIG. 2B, a uniform pattern across the map is indicative of a uniform thickness after the first oxide layer 262B of the upper Bragg reflector is trimmed.

With reference to FIG. 2A, the thickness map 200 prior to trimming, serving as a nonlimiting example, shows an average thickness 480 nm (4.8 kÅ) with a deviation of up to ±40 nm (400 Å). With reference to FIG. 2B, the generated thickness map 201 after trimming, serving as a nonlimiting example, shows an average thickness of 455 nm (4.55 kÅ) with a deviation of only about ±1 nm (10 Å) within the wafer, equivalent to about ±2000 ppm variation.

Figure 3:
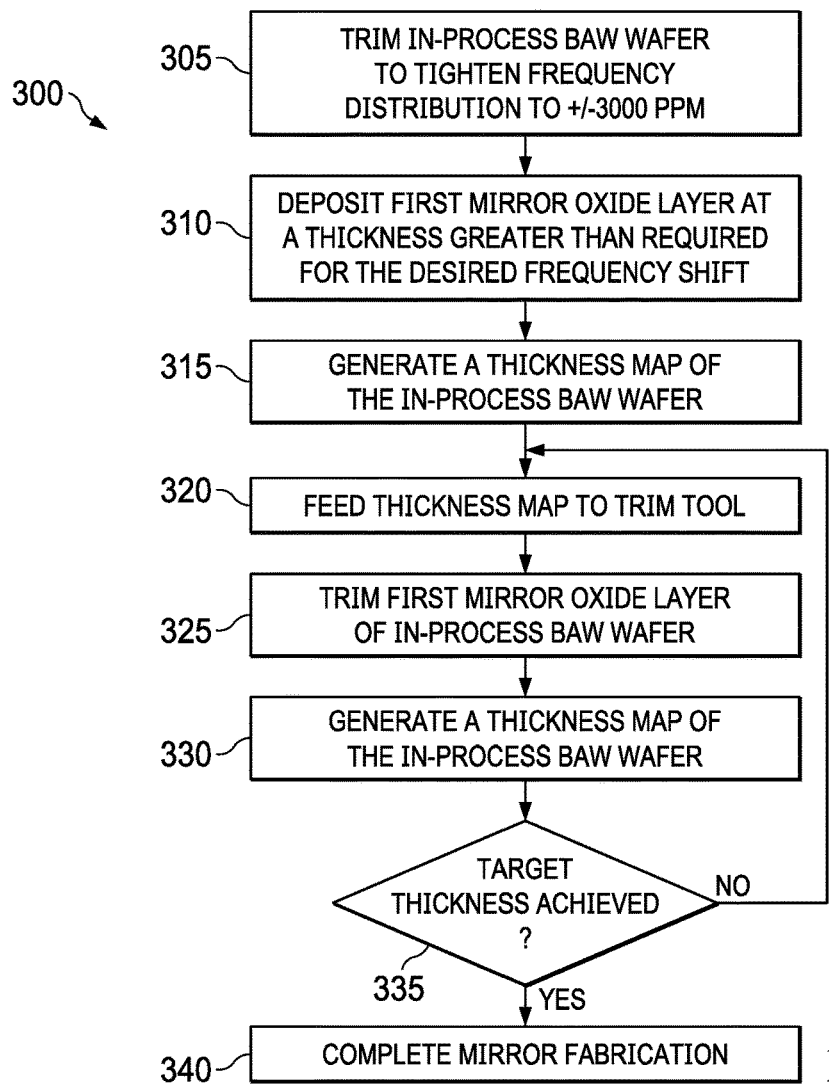
FIG. 3 Illustrates a process flow of an example of a bulk acoustic wave device fabrication procedure.

FIG. 3 provides a method 300, e.g. for producing a BAW resonator fabricated with a double Bragg mirror with low variation of operating frequencies within a production wafer. The method 300 is described without implied limitation by reference to features of the BAW device 100 (FIGS. 1A-1D). At an optional step 305, a plurality of instances of the BAW device 100, at an intermediate stage of processing on a production wafer, are pre-trimmed, e.g. to operate within ±3000 ppm of a target frequency. At step 310, the first oxide layer 162 is deposited to have a thickness greater than the thickness required for the desired frequency shift of the BAW device, as described earlier. At step 315, a thickness map is then generated that provides a value of the thickness over at least some of the instances of the BAW device 100. Next, the generated thickness map is provided to a trim tool, at step 320. At a step 325, the trim tool removes a portion of the first oxide layer 162 over at least some of the instances of the BAW device 100, where the amount removed over a particular instance of the BAW device 100 may be the difference between the measured or interpolated thickness of the first oxide layer 162, over that particular instance, and a target or desired thickness determined to provide a design operating frequency of the BAW device 100. In an example, the trim tool is an ion beam milling tool. In an optional step 330, the thickness of the first oxide layer 162 after trimming may be measured again, and a new thickness map determined. If the target thickness is confirmed, at step 335, the wafers continue processing at a step 340 to complete the upper Bragg acoustic reflector 160. If the thickness of the first oxide layer 162 is greater than the target thickness the method 300 may return to the step 320 to repeat the trimming process with the updated wafer map. Although the method 300 is described as reducing variation within a production wafer, the method 300 also may also reduce such variation between wafers in a production lot.

The layers being trimmed as disclosed herein may be accomplished iteratively in conjunction with comparing a trimmed layer thickness, determined in connection with a thickness map, with a targeted layer thickness which is intended to best achieve the desired resonant frequency of the fabricated BAW device.

The foregoing has been described herein using specific examples for the purposes of illustration only. It will be readily apparent to one of ordinary skill in the art, however, that the principles of the disclosure can be embodied in other ways. Therefore, the foregoing should not be regarded as being limited in scope to the specific examples disclosed herein, but instead as being fully commensurate in scope with the following claims.

The invention claimed is:

1. A method of manufacturing a semiconductor device comprising the steps of:
providing a wafer having a plurality of bulk acoustic wave (BAW) devices at an intermediate stage of manufacturing;
depositing a dielectric layer over the wafer;
determining a plurality of as-deposited thicknesses of the dielectric layer, each as-deposited thickness corresponding to one BAW device from the plurality of BAW devices;
forming a corresponding trimmed dielectric layer over each of the BAW devices by removing a portion of the dielectric layer over each of the BAW devices, a thickness of the removed portion determined from a corresponding as-deposited thickness and a target thickness; and
forming over each of the BAW devices a Bragg acoustic reflector that includes the corresponding trimmed dielectric layer.

2. The method of claim 1, wherein thickness nonuniformity of the dielectric layer within a production wafer is reduced by the trimming.

3. The method of claim 1, further comprising measuring a post-trim thickness of the dielectric layer over each of the plurality of bulk acoustic wave devices after trimming the dielectric layer.

4. The method of claim 1, wherein removing a portion of the dielectric layer is performed using ion beam milling.

5. The method of claim 1, wherein an amount of the dielectric layer removed is different for each bulk acoustic wave device.

6. The method of claim 1, wherein the dielectric layer comprises silicon dioxide.

7. The method of claim 1, wherein trimming the dielectric layer provides a variance of less than ±3000 parts per million of the target thickness over the plurality of bulk acoustic wave devices.

8. The method of claim 1, further comprising pre-trimming the plurality of BAW devices prior to depositing the dielectric layer, the pre-trimming limiting a variance of a pre-trim resonant frequency to ±3000 ppm.

9. The method of claim 1, further comprising separating the plurality of bulk acoustic wave devices from the wafer.

10. A method of manufacturing a semiconductor device, comprising the steps of:
providing a substrate;
forming a lower Bragg acoustic reflector over the substrate, the lower Bragg acoustic reflector having alternating layers of a low-acoustic impedance material and a high-acoustic impedance material;
forming a lower electrode over the lower Bragg acoustic reflector;
forming a piezoelectric structure over the lower electrode;
forming an upper electrode over the piezoelectric structure;
depositing a first layer of an upper Bragg acoustic reflector over the upper electrode, the first layer having a first thickness;
comparing the first thickness with a predetermined thickness of the first layer;
removing a portion from an exposed surface of the first layer;
depositing additional layers of the upper Bragg acoustic reflector over the first layer.

11. The method of claim 10, wherein the predetermined thickness is substantially equal to one quarter the wavelength of a fundamental resonant frequency of an associated BAW device.

12. The method of claim 10, wherein the upper Bragg acoustic reflector is a first upper Bragg acoustic reflector, and further comprising determining the first thickness over a plurality of upper Bragg acoustic reflectors located over the substrate, the plurality including the first upper Bragg acoustic reflector.

13. The method of claim 10, wherein the removing includes ion beam milling.

14. The method of claim 12, wherein the removing includes removing a different amount of the first layer over each of the plurality of upper Bragg acoustic reflectors.

15. The method of claim 10, further comprising determining a thickness of the first layer after the removing and before depositing the additional layers.

16. The method as recited in claim 10 wherein the semiconductor device is a BAW resonator.

17. The method as recited in claim 16 wherein the BAW resonator is a solidly mounted resonator (SMR).

18. The method of claim 17, further comprising trimming the solidly mounted resonator prior to depositing the first layer.

19. The method as recited in claim 12, further comprising separating the first upper Bragg acoustic reflector from the plurality of upper Bragg acoustic reflectors after depositing the additional layers.

20. The method as recited in claim 10, wherein the first layer comprises silicon dioxide.

* * * * *